(12) United States Patent
Sakui

(10) Patent No.: US 6,455,889 B2
(45) Date of Patent: Sep. 24, 2002

(54) SEMICONDUCTOR MEMORY DEVICE HAVING MEMORY CELLS EACH HAVING A CONDUCTIVE BODY OF BOOSTER PLATE AND A METHOD FOR MANUFACTURING THE SAME

(75) Inventor: Koji Sakui, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/756,803

(22) Filed: Jan. 10, 2001

Related U.S. Application Data

(62) Division of application No. 09/186,182, filed on Nov. 5, 1998, now Pat. No. 6,214,665.

(30) Foreign Application Priority Data

Nov. 7, 1997 (JP) .............................................. 9-305300

(51) Int. Cl.[7] ............................................ H01L 29/788
(52) U.S. Cl. ............................................................ 257/316
(58) Field of Search ................................. 257/315, 316, 257/314, 317

(56) References Cited

U.S. PATENT DOCUMENTS

| | | | |
|---|---|---|---|
| 5,032,533 A | 7/1991 | Gill et al. | |
| 5,045,491 A | 9/1991 | Gill et al. | |
| 5,677,556 A | 10/1997 | Endoh | 257/316 |
| 6,057,574 A * | 5/2000 | Hisamune | 257/315 |
| 6,166,409 A * | 12/2000 | Ratnam et al. | 257/316 |

FOREIGN PATENT DOCUMENTS

| | | | |
|---|---|---|---|
| JP | 06233316 | * | 9/1994 |
| JP | 10217366 | * | 7/1998 |

* cited by examiner

*Primary Examiner*—Fetsum Abraham
*Assistant Examiner*—Leonardo Andujar
(74) *Attorney, Agent, or Firm*—Banner & Witcoff, Ltd.

(57) ABSTRACT

A booster plate is insulatively formed on a silicon semiconductor substrate with a first gate insulation film disposed therebetween. A floating gate which forms a capacitor in cooperation with part of at least the upper surface of the booster plate is insulatively formed on the booster plate with a second insulating film disposed therebetween. Further, a control gate is insulatively formed on the floating gate with a thrid insulating film disposed therebetween.

15 Claims, 9 Drawing Sheets

| MODE NODE | WITH BOOSTER PLATE | | |
|---|---|---|---|
| | PROG | ERASE | READ |
| B/L ("0" CELL) | 0 | F | 1.8 |
| B/L ("1" CELL) | Vcc | F | 0.7 |
| SSL | Vcc | F | Vcc |
| BOOSTER PLATE | 13 | 0 | Vcc |
| W/L (SELECT) | 13 | 0 | 0 |
| W/L (UNSELECT) | Vcc | F | Vcc |
| GSL | 0 | F | Vcc |
| CSL | 0 | F | 0 |
| BULK | 0 | 16 | 0 |
FIG. 4
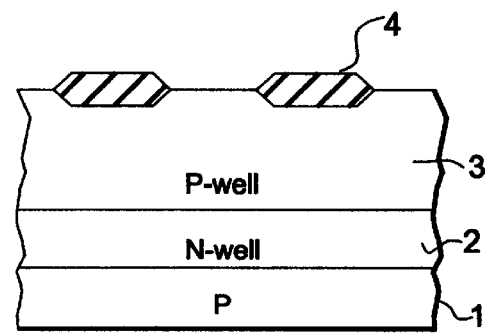
FIG. 7
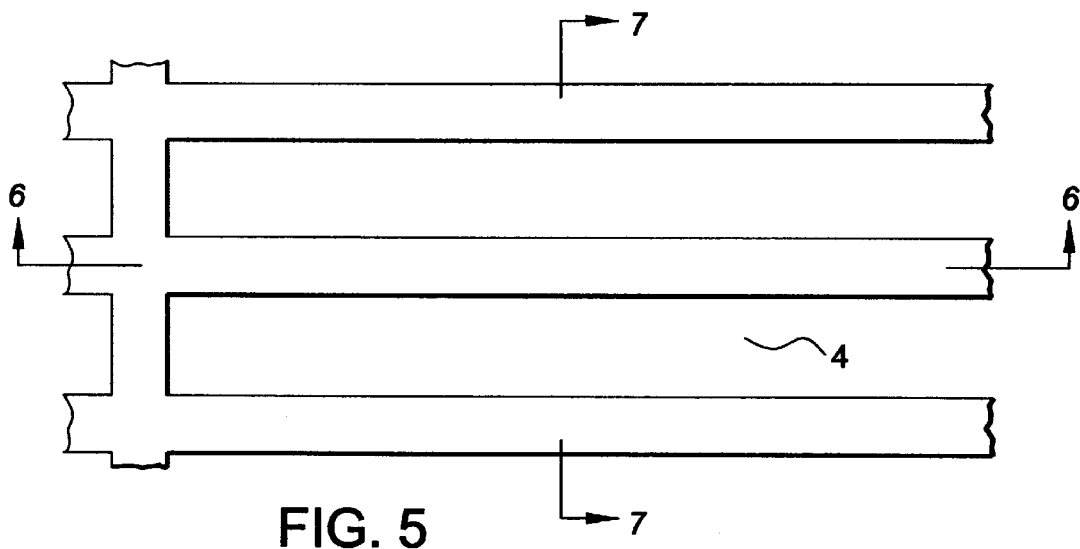
FIG. 5
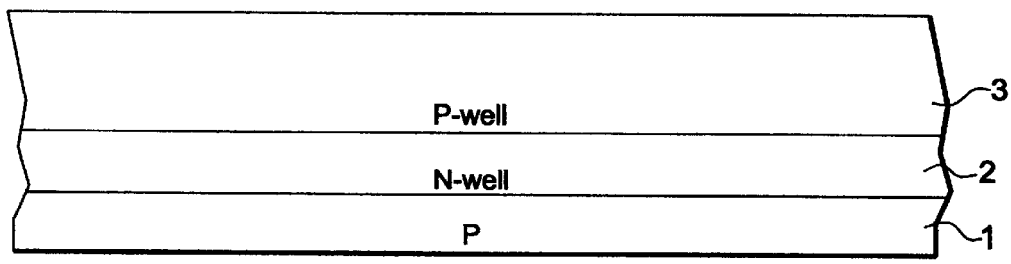
FIG. 6

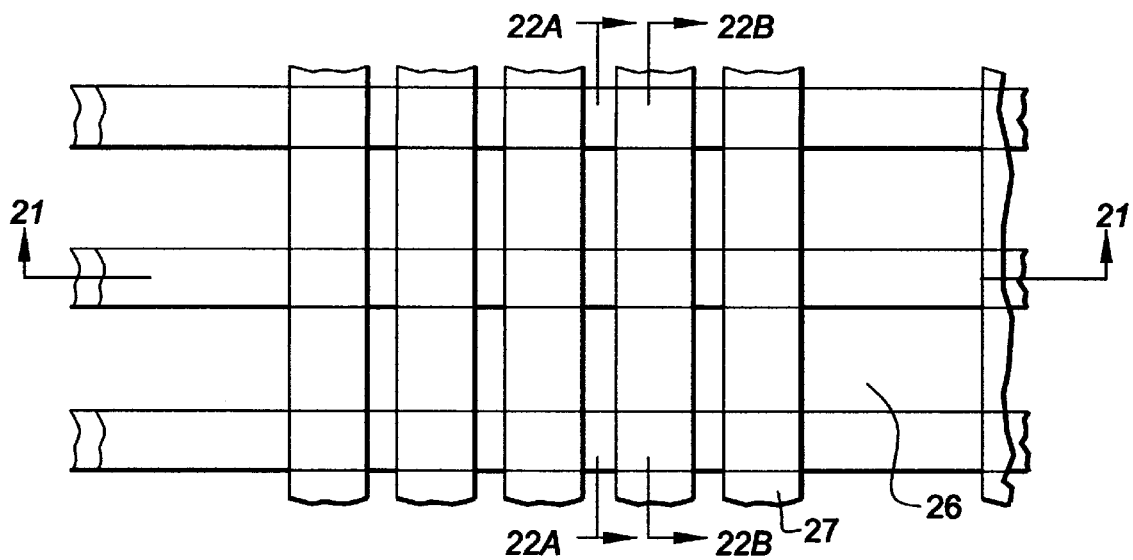
FIG. 20
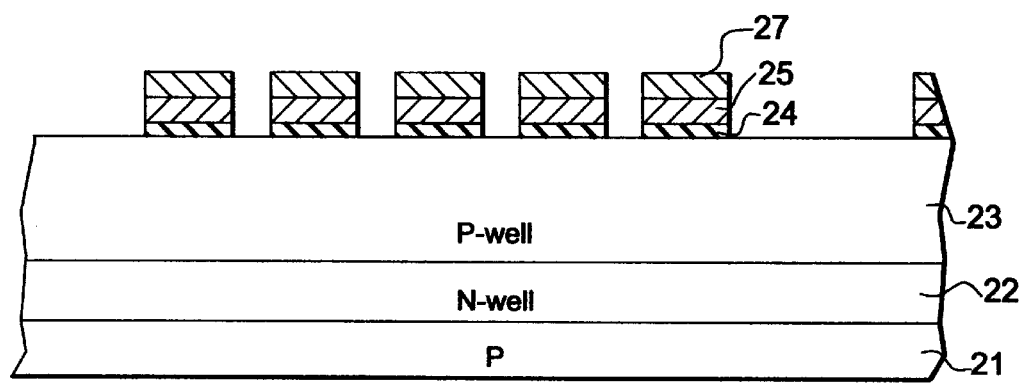
FIG. 21
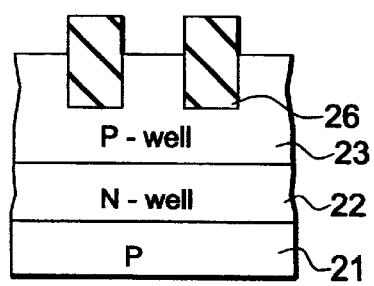 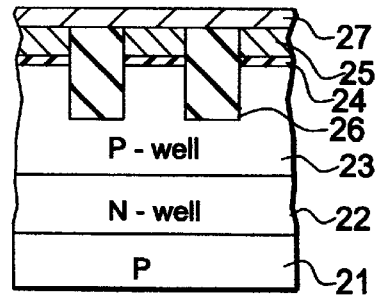
FIG. 22A  FIG. 22B

SEMICONDUCTOR MEMORY DEVICE HAVING MEMORY CELLS EACH HAVING A CONDUCTIVE BODY OF BOOSTER PLATE AND A METHOD FOR MANUFACTURING THE SAME

This application is a Divisional of U.S. application Ser. No. 09/186,182 filed on Nov. 5, 1998, now U.S. Pat. No. 6,214,665.

BACKGROUND OF THE INVENTION

This invention relates to a semiconductor memory device and a manufacturing method thereof and more particularly to a semiconductor memory device including memory cell units (NAND cells, AND cells, DINOR cells and the like) each consturcted by connecting a plurality of memory cells having conductive bodies of booster plates and a method for manufacturing the same.

Conventionally, an electrically rewritable EEPROM is known as one of the semiconductor memory devices. Among them, a NAND type EEPROM having NAND strings each constructed by serially connecting a plurality of memory cells receives much attention because it can be formed with high integration density.

The NAND type EEPROM is disclosed in K, -D. Suh et al., "A 3.3V 32Mb NAND Flash Memory with Incremental Step Pulse Programming Scheme," IEEE J. Solid-State Circuits. vol. 30, pp. 1149–1156, November 1995 (document 1 ) and Y. Iwata et al., "A 35 ns Cycle Time 3.3V Only 32Mb NAND Flash EEPROM," IEEE J. Solid-State Circuits, vol. 30, pp. 1157–1164, November 1995 (document 2).

In the program operation of the EEPROM disclosed in the above documents, the channel potential of a program inhibition NAND string in the selected block is determined by the capacitive coupling between the word line and the channel. Therefore, in order to set the program inhibition voltage to a sufficiently high voltage, it is important to sufficiently effect the initial charging operation of the channel and set the capacitive coupling ratio between the word line and the channel to a relatively large value.

The capacitive coupling ratio B between the word line and the channel is calculated by the following equation.

$$B=C_{ox}/(C_{ox}+C_j)$$

where Cox is the total sum of the gate capacitances between the word line and the channel and Cj is the total sum of junction capacitances of the source and drain of a cell transistor.

On page 1153 of the document 1, it is described that the coupling ratio is 80%, but in order to obtain this value, it is necessary to reduce the junction capacitance Cj to ¼ of that of the conventional case, for example. However, in order to reduce the junction capacitance, the impurity concentration of a P well must be made low or the impurity concentrations of the source and drain of the cell transistor must be made low. If the impurity concentration of the P well is lowered, the field withstand voltage between memory cells will be lowered, and therefore, there is a limitation in lowering the impurity concentration. Further, if the impurity concentrations of the source and drain of the cell transistor are lowered, the resistances of the source and drain are increased, thereby causing a cell current to be reduced.

Therefore, as a method for increasing the gate capacitance Cox and reducing the junction capacitance Cj, there is proposed a method for setting the word line pitch to 2F when the design rule is set to F, and as a result, reducing the space between the adjacent word lines to reduce the junction capacitance Cj as is disclosed in a document by R. Shiorta et al., "A 2.3 $\mu m^2$ Memory Cell Structure for 16Mb NAND EEPROMs," in IEDM'90 Technical Digest, pp. 103–106. December 1990 (document 3).

However, in this method, since two mask members are used when the word line is etched, there occurs a problem that misalignment occurs between a silicon nitride film (SiN) which is the first mask member and a resist which is the second mask member. Therefore, a problem relating to the process occurs and the manufacturing yield is lowered. Further, two processing masks for word lines are required and the manufacturing process becomes complicated and the manufacturing cost is made high.

Further, a method for reducing the junction capacitance Cj by negatively biasing the P well at the time of program to expand the depletion layer of the junction capacitance is provided. However, the junction capacitance is approximately inversely proportional to the reciprocal of the square root of the sum of the built-in potential of the junction and the reverse bias. Therefore, even if −2V is applied to the P well with respect to the channel potential of 6V, for example, the junction capacitance is reduced to only approx. 90% and a significant effect cannot be expected. Further, an additional circuit, power and time for applying a negative bias to the P well are required.

As described above, various methods for increasing the coupling ratio B are proposed, but each method has the problem as described above.

In the document 2 and Tanaka et al., "A Quick Intelligent Program Architecture for 3V-Only NAND-EEPROM's," in Symp. VSLI Circuits Dig. Tech. Papers, June 1992, pp. 20–21 (document 4), the channel potential of the program inhibition NAND string at the time of program is applied in a manner different from that of the document 1. That is, in the document 1, the channel potential is raised by use of the capacitive coupling between the word line and the channel set in the electricaly floating state, but in the document 2 and document 4, a program inhibition voltage raised by the charge pump of the peripheral circuit in the chip is directly applied to the channel from the sense amplifier via the bit line.

As the problem of the EEPROM described in the document 2 and document 4, the following two problems are given. First, since the program inhibition voltage is supplied from the sense amplifier to the bit line, it is necessary to form the transistors constituting the sense amplifier by use of high breakdown voltage transistors on the design condition of the sense amplifier.

When the power supply voltage Vcc is 3.3V, a transistor applied with the voltage Vcc can be designed as a transistor which has a thin gate oxide film having a film thickness of 120 angstrom, for example, and has a short gate length. That is, the transistor can be designed by use of the severe design rule of 0.4 $\mu m$, for example.

However, if the program inhibition voltage is set at 8V, it is required to design a transistor which can withstand the voltage as a transistor having a thick gate oxide film with a film thickness of 200 angstrom, for example, and has a long gate length of 1 $\mu m$. That is, it is necessary to design the transistor with the relatively large design rule of 1 $\mu m$, for example. Therefore, the layout area of the sense amplifier is increased and it is difficult to arrange the sense amplifier in the narrow bit line pitch.

As the second problem, it becomes necessary to apply a high voltage to a selected gate line and non-selected word line which correspond to pass transistors by taking the threshold voltages thereof into consideration in order to input the program inhibition voltage to the channel via the bit line. Application of a high voltage to the non-selected word line causes a problem that the non-selected cell of the NAND string to be programmed is erroneously programmed. Therefore, in the document 2 and document 4, the program inhibition voltage is limited to such a potential which does not cause the erroneous programming and there occurs a problem that the permissible potential width (window) of the program inhibition voltage is narrowed.

Further, if a high voltage is applied to the selected gate line, a strong electric field is applied to the gate oxide film of the NAND string to be programmed since the channel potential of the NAND string to be programmed is Vss (0V), and there occurs a problem that the gate oxide film of the selected gate transistor will be broken.

As the measure for coping with the above problems, recently, a NAND type EEPROM in which the channel potential of a non-programming NAND string is set high by use of conductive bodies of booster plates and the program/erase/read voltage is lowered is proposed. The NAND type EEPROM having the booster plates is disclosed in a document by J. D. Choi et al., "A Novel Booster Plate Technology in High Density NAND Flash Memories for Voltage Scaling-Down and Zero Program Disturbance," in Symp. VLSI Technology Dig. Tech. Papers, June 1996, pp. 238–239 (document 5).

The NAND type EEPROM having the booster plates has two advantages. The first advantage is that the capacitive coupling $\gamma$ at the time of program becomes large. In the NAND type EEPROM having no booster plate, the capacitive coupling $\gamma$ is expressed by the following equation.

$$\gamma = Ccf/(Cfs+Ccf)$$

where Ccf is a capacitance between the control gate (word line) and the floating gate and Cfs is a capacitance between the floating gate and the substrate. The capacitive coupling $\gamma b$ of the NAND type EEPROM having the booster plates is expressed by the following equation.

$$\gamma b = (Ccf+Cbf)/(Cfs+Ccf+Cbf)$$

where Cbf is a capacitance between the booster plate and the floating gate. Thus, the capacitive coupling $\gamma b$ is larger than the capacitive coupling $\gamma$ in a case where no booster plate is used. Therefore, the program voltage at the time of program can be lowered.

Since the capacitive coupling ratio at the time of erase is expressed by $(1-\gamma b)$, the potential difference between the substrate and the floating gate can be made large and it is possible to attain a high speed erase operation or lower the erase voltage in comparison with a case where no booster plate is used. Further, if $\gamma b$ is increased, a voltage applied to the pass transistor at the read time can be lowered.

The second advantage is that the capacitive coupling ratio between the control gate (word line) and the channel becomes larger. The capacitive coupling ratio Bb in a case where the booster plates are used is expressed by the following equation.

$$Bb = (Cox+Cboot)/(Cox+Cboot+Cj)$$

where Cox is the total sum of gate capacitances between the control gate (word line) and the channel, Cboot is the total sum of gate capacitances between the booster plate and the channel and Cj is the total sum of junction capacitances of the source and drain of the cell transistor. Therefore, even if the voltage of the pass transistor is not excessively raised at the time of program, the channel potential of the program inhibition NAND string can be raised and the margin against the erroneous programming can be increased.

In the NAND type EEPROM described in the document 5, the capacitance Cbf between the booster plate and the floating gate is determined by the area of the side wall of the floating gate. Therefore, in order to further increase the capacitance Cbf, it is necessary to increase the film thickness of the floating gate to make the side wall high, reduce the film thickness of the plate oxide film lying between the side wall of the floating gate and the booster plate, or increase the dielectric constant of a material of the plate oxide film.

However, if the film thickness of the floating gate is increased, a difference in level in the floating gate becomes larger, making it difficult to effect the succeeding process. Further, if the film thickness of the plate oxide film is reduced or a material with the high dielectric constant is used as the plate oxide film, there is a limitation in the reliability. Therefore, in the NAND type EEPROM described in the document 5, it is difficult to further increase the capacitance Cbf and lower the program, erase, read voltages.

Further, in the NAND type EEPROM described in the document 5, since the ion-implantation into the source/drain regions of the cell transistors of the NAND string is effected after the control gates (word lines) are formed, there occurs a problem that the coupling ratio between the control gate (word line) and the channel is made smaller by the junction capacitance Cj.

BRIEF SUMMARY OF THE INVENTION

An object of this invention is to provide a semiconductor memory device capable of increasing the capacitance between the booster plate and the floating gate the effecting the program/erase/read operations at a low voltage and a method for manufacturing the same. Further, an object of this invention is to provide a semiconductor memory device and a method for manufacturing the same in which the junction capacitance of the channel portion of the memory cell is made small and the capacitive coupling ratio between the control gate and the channel is increased so as to enhance the program inhibition voltage at the time of program and enlarge the margin against the erroneous programming, thereby making it possible to enhance the reliability.

In order to attain the above object, a semiconductor memory device according to this invention comprises a conductive body formed on a semiconductor substrate; a floating gate insulatively formed on the conductive body with an insulating film disposed therebetween, a capacitor being formed between the floating gate and part of the upper surface and the side wall of the conductive body; and a control gate insulatively formed on the floating gate with gate insulating film disposed therebetween.

According to the semiconductor memory device with the above structure, a capacitance between the booster plate (conductive body) and the floating gate can be increased. As a result, the program/erase/read operations can be effected at a low voltage.

Further, a semiconductor memory device according to this invention comprises conductive bodies formed on a semiconductor substrate; floating gates insulatively formed on the conductive bodies with an insulating film disposed therebetween, capacitors being each formed between the floating gate and at least part of the upper surface of the conductive body; control gates insulatively formed on the floating gates with an insulating film disposed therebetween; and at least one memory cell unit including a plurality of memory cell transistors each of which includes a corresponding one of the floating gates and a corresponding one of the control gates.

According to the semiconductor memory device with the above structure, a capacitance between the booster plate (conductive body) and the following gate can be increased. As a result, the program/erase/read operation can be effected at a low voltage.

In above semiconductor memory device, regions of the semiconductor substrate which lie below the conductive body and the floating gate have the same conductivity type.

With the semiconductor memory device of the above structure, since a diffusion layer having a different conductivity type from that of the channel portion is not formed in the region of the semiconductor substrate which lies directly below the booster plate (conductive body), the junction capacitance of the channel portion of the memory cell can be made small and the capacitive coupling ratio between the control gate and the channel portion can be increased. As a result, the program inhibition voltage at the time of program can be enhanced and the margin against the erroneous programming can be enlarged.

Further, a method for manufacturing a semiconductor memory device having memory cells according to this invention comprises the steps of forming a first insulating film on a semiconductor substrate; forming a first conductive film on the first insulating film; patterning the first conductive film in a linear form along the wiring direction of control gates of the memory cells; forming a second insulating film on the first conductive films linearly patterned; insulatively forming floating gates on part of the upper surfaces and the side surfaces of the first conductive films with the second insulating film disposed therebetween; forming third insulating films on the floating gates; and forming control gates on the third insulating films.

According to the method for manufacturing the semiconductor memory device having the above steps, a semiconductor memory device having memory cells in each of which a capacitance between the booster plate (conductive body) and the floating gate can be increased can be manufactured.

Further, a method for manufacturing a semiconductor memory device having at least one memory cell unit including a plurality of memory cells according to this invention comprises the steps of forming element isolation regions on a semiconductor substrate; forming a first insulating film on the semiconductor substrate; forming a first conductive film on the first insulating film; patterning the first conductive film into a plurality of linear portions along the control gate line direction of the memory cells; forming a second insulating film on the first conductive films patterned into the linear portions; forming a second conductive film on the second insulating film; forming isolation trenches in the second conductive film above the element isolation regions which are adjacent in the control gate line direction of the memory cells; forming a third insulating film on the second conductive film; forming a third conductive film on the third insulating film; patterning the third conductive film, third insulating film and second conductive film in a self-alignment manner to form control gate lines formed of the third conductive film and floating gates formed of the second conductive film at least between the first conductive films which are adjacent to each other; and forming diffusion layers in a self alignment manner in regions acting as source/drain regions of the at least one memory cell unit by ion-implantation by use of the first conductive films patterned into the linear portions and the control gate lines.

According to the method for manufacturing the semiconductor memory device having the above steps, a semiconductor memory device having at least one memory cell unit in which a capacitance between the booster plate (conductive body) and the floating gate can be increased can be manufactured. Further, according to the manufacturing method, since a diffusion layer having a different conductivity type from that of the channel portion is not formed in the region of the semiconductor substrate which lies directly below the booster plate (conductive body), a semiconductor memory device having at least one memory cell unit in which the junction capacitance of the channel portion of each memory cell can be made small and the capacitive coupling ratio between the control gate and the channel portion can be increased can be manufactured.

Further, a method for manufacturing a semiconductor memory device having memory cells according to this invention comprises the steps of forming a first insulating film on a semiconductor substrate; forming a first conductive film on the first insulating film; forming a second conductive film on the first conductive film; patterning the second and first conductive films in a linear form along the wiring direction of control gates of the memory cells; forming a second insulating film on laminated bodies of the second and first conductive films linearly patterned; insulatively forming floating gates on part of the upper surfaces and the side surfaces of the laminated bodies of the second and first conductive films with the second insulating film disposed therebetween; forming third insulating films on the floating gates; and forming control gates on the third insulating films.

According to the method for manufacturing the semiconductor memory device having the above steps, a semiconductor memory device having memory cells in each of which a capacitance between the booster plate (conductive body) and the floating gate can be increased can be manufactured.

Further, a method for manufacturing a semiconductor memory device having at least one memory cell unit including a plurality of memory cells according to this invention comprises the steps of forming a first insulating film on a semiconductor substrate; forming a first conductive film on the first insulating film; patterning the first conductive film into a present pattern and forming element isolation trenches in the semiconductor substrate with the preset pattern used as a mask; filling an insulating material into the element isolation trenches to form element isolation regions; forming a second conductive film on the semiconductor substrate; patterning the second and first conductive films into a plurality of linear portions along the wiring direction of control gates of the memory cells; forming a second insulating film on laminated bodies of the second and first conductive films patterned into the linear portions; forming a third conductive film on the second insulating film; forming isolation trenches in the third conductive film above the element isolation regions which are adjacent in the control gate line direction of the memory cells; forming a third insulating film on the third conductive film; forming a fourth conductive film on the third insulating film; patterning the fourth conductive film, third insulating film and third conductive film in a self-alignment manner to form control gate lines formed of the fourth conductive film and floating gates formed of the third conductive film at least between the laminated bodies of the second and first conductive films; and forming diffusion layers in a self-alignment manner in regions acting as source/drain regions of the at least one memory cell unit by ion-implantation by use of the laminated bodies of the second and first conductive films patterned into the linear portions and the control gate lines.

According to the method for manufacturing the semiconductor memory device having the above steps, a semiconductor memory device having at least one memory cell unit in which a capacitance between the booster plate (conductive body) and the floating gate can be increased can be manufactured. Further, according to the manufacturing method, since a diffusion layer having a different conductivity type from that of the channel portion is not formed in the region of the semiconductor substrate which lies directly below the booster plate (conductive body), a semiconductor memory device having at least one memory cell unit in which the junction capacitance of the channel portion of the memory cell can be made small and the capacitive coupling ratio between the control gate and the channel portion can be increased can be manufactured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in a constitute a part of the specification, illustrate presently preferred embodiments of the invention, and together with the general description given above and the detailed description of the preferred embodiments given below, serve to explain the principles of the invention.

FIG. 4 is a diagram showing the bias state of the program, erase and read operations in the NAND type EEPROM of the first embodiment;

FIG. 5 is a plan view showing a manufacturing step of the NAND type EEPROM of the first embodiment;

FIG. 6 is a cross sectional view taken along the bit line direction of FIG. 5;

FIG. 7 is a cross sectional view taken along the word line direction of FIG. 5;

FIG. 20 is a plan view showing a manufacturing step of the NAND type EEPROM of the second embodiment;

FIG. 21 is a cross sectional view taken along the bit line direction of FIG. 20;

FIG. 22A is a cross sectional view taken along the word line direction of FIG. 20;

FIG. 22B is a cross sectional view taken along the word line direction of FIG. 20;

DETAILED DESCRIPTION OF THE INVENTION

There will now be described semiconductor memory devices according to embodiments of this invention by taking a NAND type EEPROM as an example with reference to the accompanying drawings. First, the construction of a NAND type EEPROM according to a first embodiment of this invention is explained.

Figure 1:
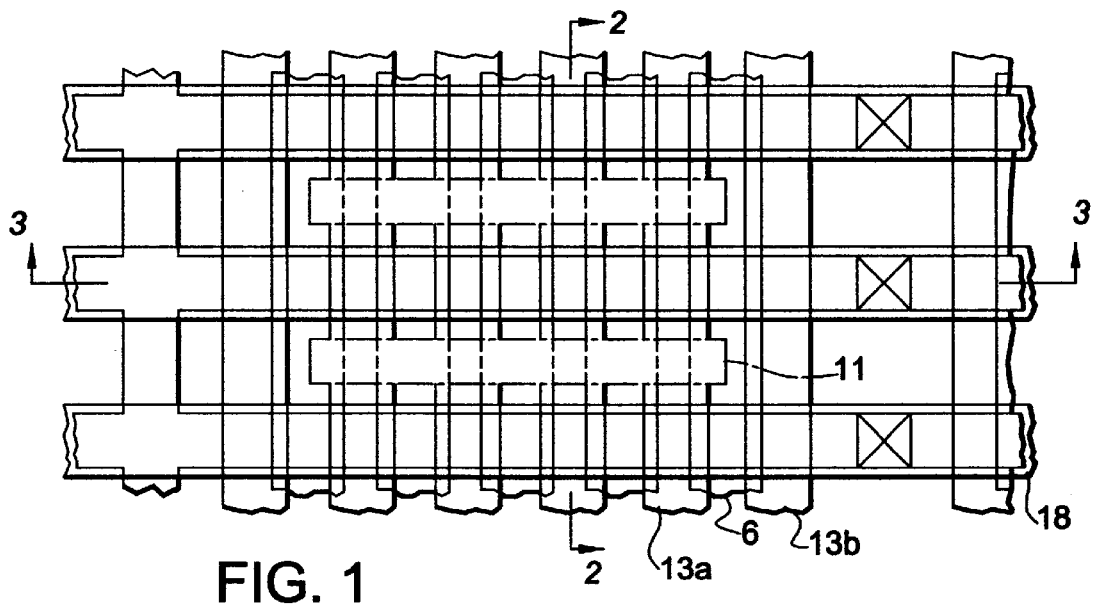
FIG. 1 is a plan view showing the construction of a NAND type EEPROM according to a first embodiment of this invention.
Figure 2:
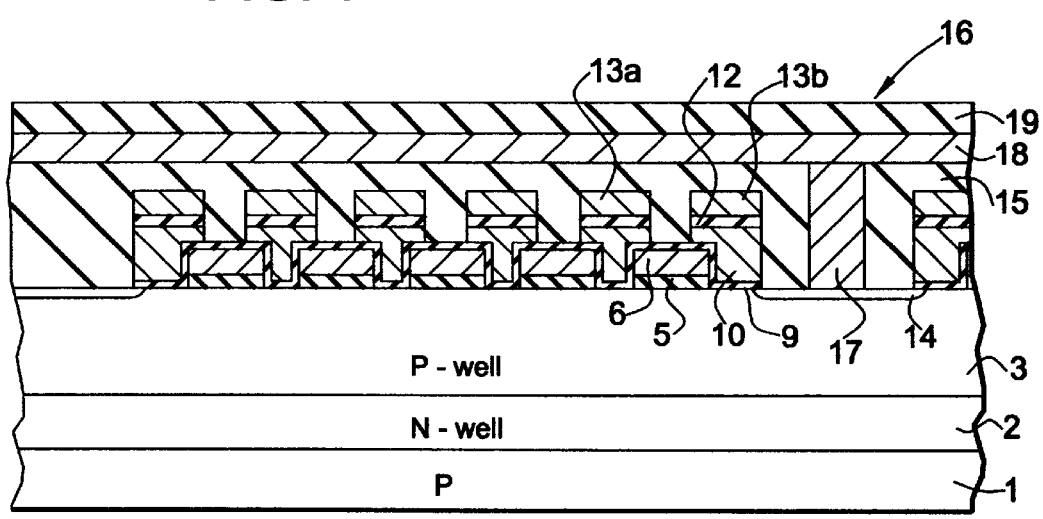
FIG. 2 is a cross sectional view taken along the line 2—2 of FIG. 1.

FIG. 1 is a plan view showing the construction of a NAND type EEPROM according to a first embodiment of this invention. FIG. 2 is a cross sectional view taken along the line 2—2 of FIG. 1 is a cross sectional view taken along the line 3—3 of FIG. 1.

Figure 3:
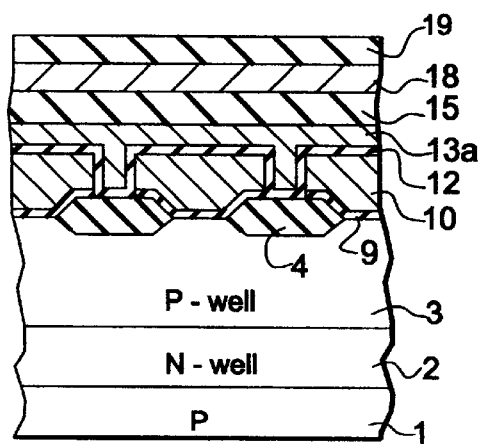
FIG. 3 is a cross sectional view taken along the line 3—3 of FIG. 1.

As shown in FIG. 2, an N well 2 is formed on a P-type silicon semiconductor substrate 1. A P well 3 is formed in the N well 2. As shown in FIG. 3, field oxide films (element isolation insulating films) 4 which are element isolation regions are formed on the P well 3. A NAND cell having four memory cell transistors and two selection gate transistors disposed on both sides thereof is formed in a region surrounded by the field oxide film 4 as follows.

As shown in FIG. 2, first gate insulating films 5 each formed of a thermal oxide film with a film thickness of 5 nm to 20 nm is formed on the P well 3. Further, booster plates 6 each formed of a conductive body which is constructed by a first polysilicon film (or a first laminated film of a silicide film and a polysilicon film) with a film thickness of 100 nm or more are formed on part of the field oxide films 4 and the first gate insulating films 5 in a linear form extending along the direction of word lines 13*a*.

Further, as shown in FIG. 2, a second gate insulating film 9 formed of a thermal oxide film with a film thickness of 5 nm to 10 nm is formed on the P well 3 and the booster plates 6. Floating gates 10 each formed of a second polysilicon film (or a second laminated film of a silicide film and a polysilicon film) with a film thickness of 100 nm or more is formed on the second gate insulating film 9.

A third gate insulating film 12 with a film thickness of 15 nm to 40 nm is formed on each of the floating gates 10 as shown in FIGS. 2 and 3. Further, a third polysilicon film (or a third laminated film of a silicide film and a polysilicon film) with a film thickness of 100 nm to 400 nm is formed on each of the third gate insulating films 12. The word lines (control gates) 13*a* of the four memory cell transistors and the selection gate lines 13*b* of the selection gate transistors disposed on both sides of the memory cell transistors are formed of the third polysilicon films (or the third laminated films). Further, in the drain portion and source portion of the NAND cell, N$^+$ diffusion layers 14 are formed.

As shown in FIG. 2, an insulating film 15 is deposited on the entire surface of the resultant structure and the tungsten plug 17 connected to the drain portion or source portion is formed in the insulating film 15. Further, a bit line 18 connected to the tungsten plug 17 is formed on the insulating film 15. The bit line 18 is formed of aluminum (A1), for example. A passivation film 19 is formed on the entire surface of the resultant structure.

That is, the NAND type EEPROM of the first embodiment is constructed as follows. The booster plates (first electrodes) 6 are insulatively formed on the P-type silicon semiconductor substrate 1 with the first gate insulating films 5 disposed therebetween and the floating gates (second electrodes) 10 are insulatively disposed on at least parts of the upper surfaces of the booster plates 6 with the gate insulating film 9 disposed therebetween. Further, the word lines (third electrodes) 13*a* are formed above the floating gates 10 with the third gate insulating films 12 disposed therebetween. A memory cell unit (NAND cell) is constructed by serially connecting a plurality of (in this example, four) electrically rewritable memory cells each having the above two-layered stacked structure and connecting the selection gate transistors to both sides of the series-connected memory cells. Then, memory cell units having the same construction as the above memory cell unit are arranged in a matrix form to form a memory cell array.

The NAND type EEPROM has the selection gate lines 13*b*, row selection means and column selection means. The selection gate line 13*b* is arranged to cross the bit line 18 to connect the memory cell unit to the bit line 18 or common source line (not shown). The row selection means selects the word line 13*a* and selection gate line 13*b* of the memory cell array. The column selection means selects one of the bit lines 18 of the memory cell array.

The operation of the NAND type EEPROM with the above construction is substantially the same as that of the NAND type EEPROM disclosed in the document 5 and the bias states at the time of the program, erase and read operations are shown in FIG. 4. The booster plate 6 is applied with a program voltage of 13V at the time of program, a voltage of 0V at the time of erase and a power supply voltage Vcc at the time of read.

Now, the above-described two advantages of the memory cell having the booster plate are considered. First, the capacitive coupling ratio at the time of program becomes as follows. As described above, the capacitive coupling ratio γb of the memory cell having the booster plate is expressed as follows.

$$\gamma b = (Ccf + Cbf)/(Cfs + Ccf + Cbf)$$

where Ccf is the capacitance between the control gate (word line) and the floating gate, Cbf is the capacitance between the booster plate and the floating gate, and Cfs is the capacitance between the floating gate and the substrate.

Cbf of the memory cell in the NAND type EEPROM disclosed in the document 5 is determined by the capacitance formed between the side wall of the floating gate and the booster plate. However, in the memory cell of the NAND type EEPROM of the first embodiment, Cbf is the sum of the capacitance formed between the side wall of the booster plate 6 and the floating gate 10 and the capacitance formed between part of the upper surface of the booster plate 6 and the floating gate 10. Therefore, since the capacitive coupling ratio γb becomes larger in the memory cell in the first embodiment than in the memory cell in the NAND type EEPROM disclosed in the document 5, the program voltage at the time of program can be lowered.

Further, since the capacitive coupling ratio at the time of erase is expressed by (1−γb), a potential difference between the substrate and the floating gate 10 can be increased, the erase operation can be effected at a higher speed or the erase voltage can be lowered in comparison with a case of the NAND type EEPROM disclosed in the document 5. If the capacitive coupling ratio γb becomes larger, a voltage applied to the pass transistor at the time of read can be lowered.

Next, the capacitive coupling ratio between the control gate (word line) and the channel which is the other advantage is as follows. As described above, the capacitive coupling ratio Bb of the memory cell having the booster plate is expressed by the following equation.

$$Bb = (Cox + Cboot)/(Cox + Cboot + Cj)$$

where Cox is the total sum of gate capacitances between the control gate (word line) and the channel, Cboot is the total sum of gate capacitance between the booster plate and the channel, and Cj is the total sum of junction capacitances of the source and drain of the memory cell transistor.

In the memory cell of the NAND type EEPROM disclosed in the document 5, the source/drain region is formed directly below the booster plate. However, in the memory cell of the NAND type EEPROM of the first embodiment, the source/drain region directly below the booster plate 6 is omitted and the portion can be formed as a semiconductor region having the same conductivity type as a portion directly below the floating gate. Therefore, the junction capacitance Cj of the channel portion of the NAND cell becomes smaller and the capacitive coupling ratio between the control gate (word line) 13*a* and the channel can be made larger. As a result, even if the voltage of the pass transistor is not set to an excessively high voltage at the time of program, the channel potential of the program inhibition NAND cell can be sufficiently raised and the margin against the erroneous programming can be improved.

Next, a method for manufacturing the NAND type EEPROM of the first embodiment is explained. FIGS. 5 to 16 are plan views of cross sectional views showing the manufacturing process of the NAND type EEPROM of the first embodiment. FIGS. 5, 8, 11, 14 are plan views showing the manufacturing process of the NAND type EEPROM of the first embodiment. FIGS. 6, 9, 12, 15 are cross sectional views taken along the bit line direction of the above plan views and FIGS. 7, 10, 13, 16 are cross sectional views taken along the word line direction of the above plan views.

As shown in FIGS. 5 to 7, an N well 2 is formed on a p-type silicon semiconductor substrate 1 and a P well 3 is formed in the N well 2. Field oxide films (element isolation insulating films) 4 are formed on the P well 3. A method for manufacturing a NAND cell in a region surrounded by the field oxide film 4 is explained below. In this example, it is assumed that the NAND cell is formed of four memory cell transistors and two selection gate transistors disposed on both sides of the memory cell transistors.

Figure 8:
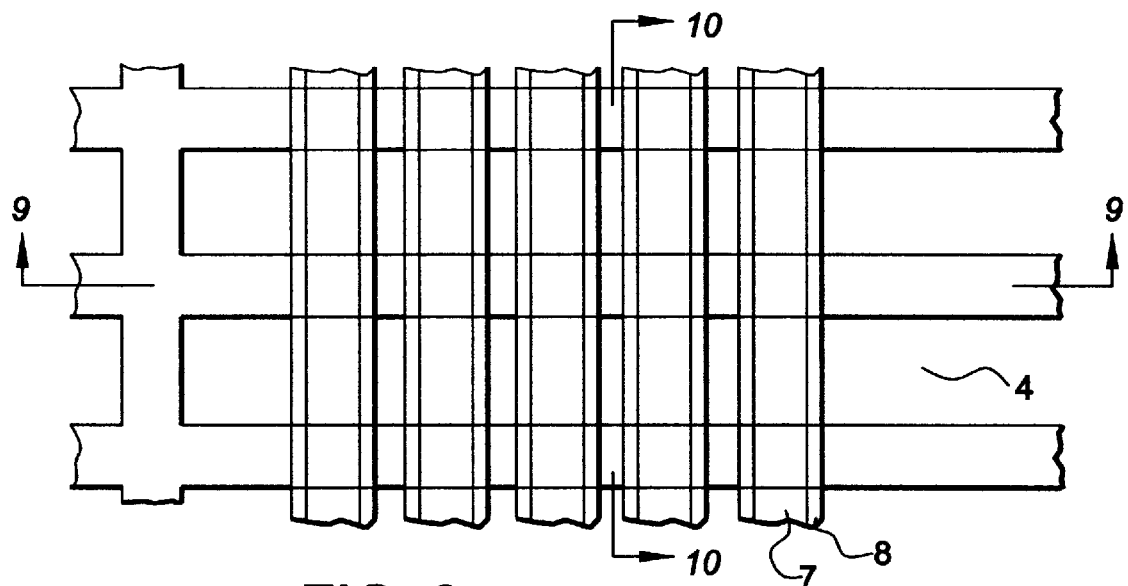
FIG. 8 is a plan view showing a manufacturing step of the NAND type EEPROM of the first embodiment.
Figure 9:
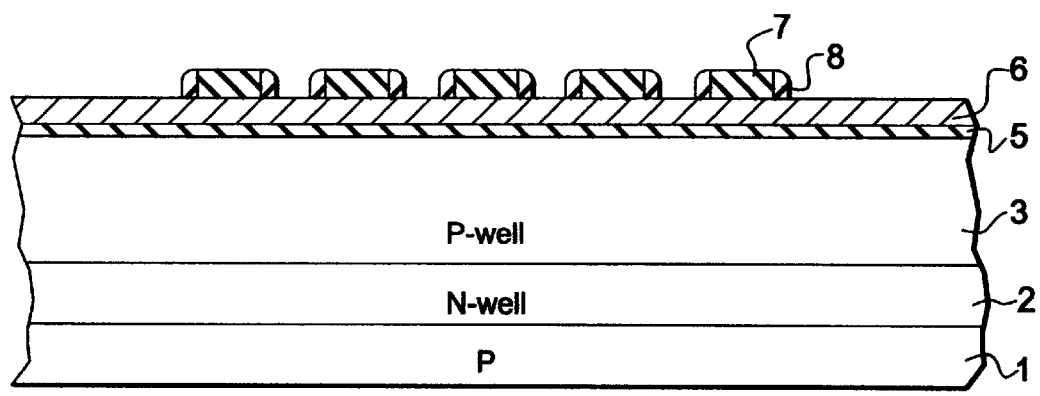
FIG. 9 is a cross sectional view taken along the bit line direction of FIG. 8.
Figure 10:
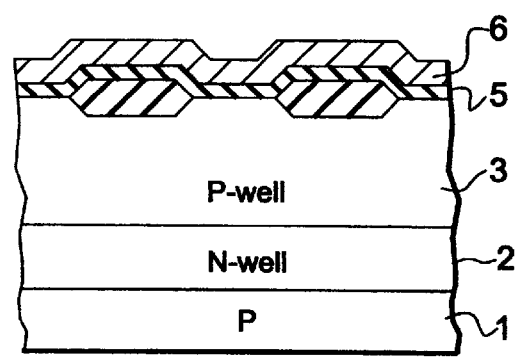
FIG. 10 is a cross sectional view taken along the word line direction of FIG. 8.

After forming the field oxide films 4 on the P well 3, a first gate insulating film 5 formed of a thermal oxide film with the film thickness of 5 nm to 20 nm is formed as shown in FIGS. 8 to 10. Further, a first polysilicon film (or a first laminated film of a silicide film and a polysilicon film) 6 with a film thickness of 100 nm or more is formed on the first gate insulating film 5.

Next, as shown in FIG. 9, silicon nitride films (SiN) 7 used as a mask member are formed by the lithography method and side wall films 8 are formed on the side walls of the silicon nitride films 7. Then, as shown in FIG. 12, the first gate insulating film 5, and first polysilicon film (or the first laminated film) 6 are etched in a linear form along the gate line direction to form booster plates 6 by using the silicon nitride films 7 and the side wall films 8 as a mask.

Figure 11:
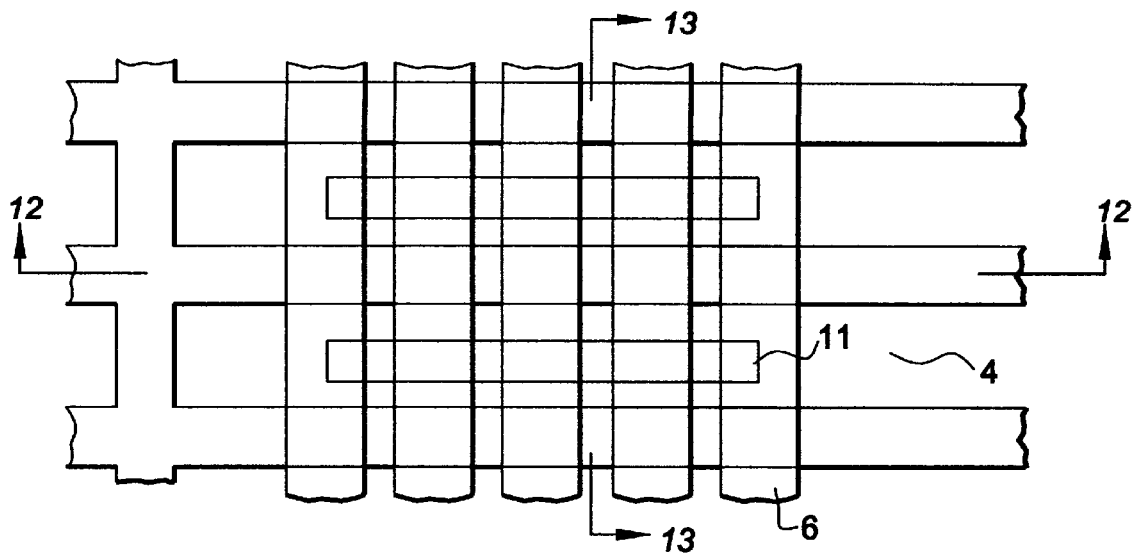
FIG. 11 is a plan view showing a manufacturing step of the NAND type EEPROM of the first embodiment.
Figure 12:
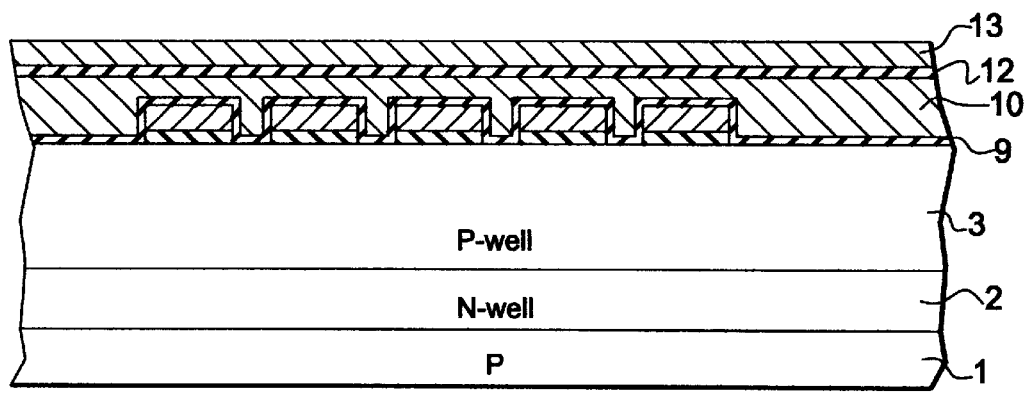
FIG. 12 is a cross sectional view taken along the bit line direction of FIG. 11.
Figure 13:
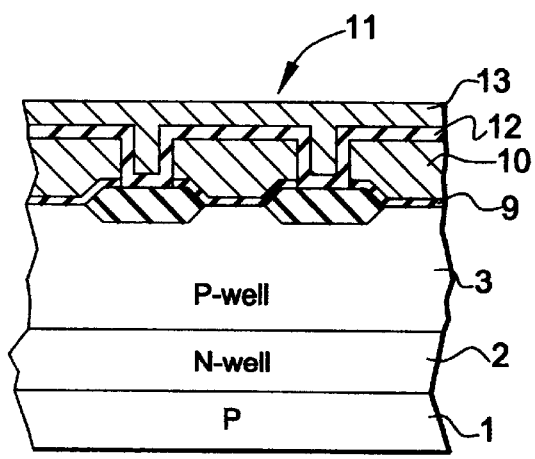
FIG. 13 is a cross sectional view taken along the word line direction of FIG. 11.

Next, as shown in FIGS. 12, 13, a second gate insulating film 9 formed of a thermal oxide film with a film thickness of 5 nm to 10 nm is formed. Then, a second polysilicon film (or a second laminated film of a silicide film and a polysilicon film) 10 with a film thickness of 100 nm or more is formed on the second gate insulating film 9. Further, as shown in FIGS. 11, 13, isolation trenches 11 are formed in the second polysilicon film (or the second laminated film) 10 on the field oxide films 4 which are adjacent to each other in the control gate line direction.

After this, a third gate insulating film 12 with a film thickness of 15 nm to 40 nm is formed on the second polysilicon film (or the second laminated film) 10. Further, a third polysilicon film (or a third laminated film of a silicide film and a polysilicon film) 13 with a film thickness of 100 nm to 400 nm is formed on the third gate insulating film 12.

Figure 14:
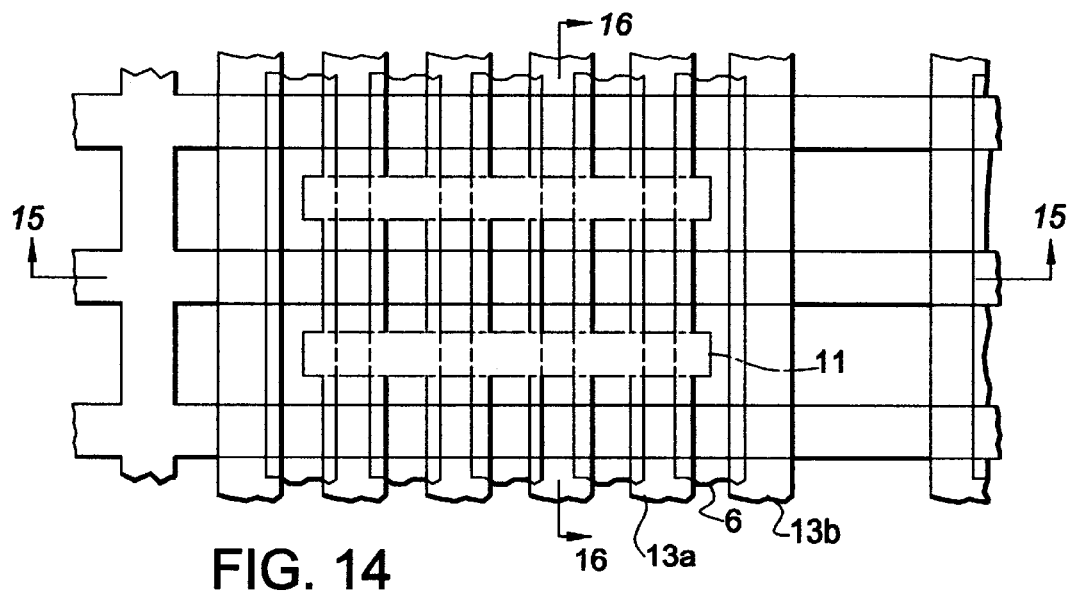
FIG. 14 is a plan view showing a manufacturing step of the NAND type EEPROM of the first embodiment.
Figure 15:
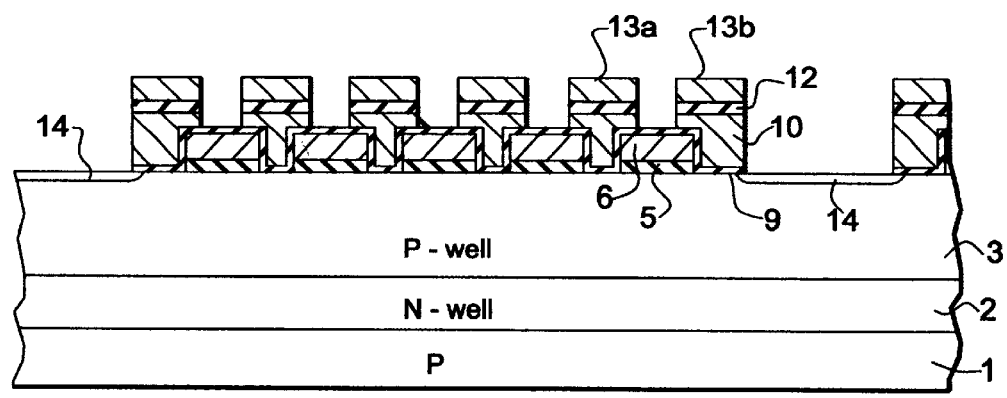
FIG. 15 is a cross sectional view taken along the bit line direction of FIG. 14.
Figure 16:
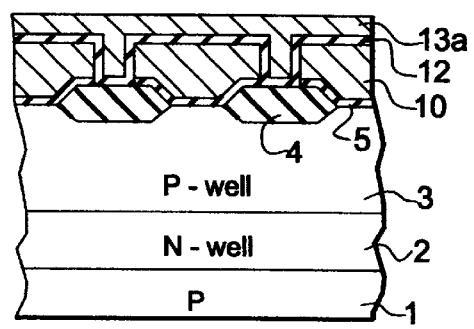
FIG. 16 is a cross sectional view taken along the word line direction of FIG. 14.

Next, as shown in FIGS. 14 to 16, the third polysilicon film (or the third laminated film) 13, third gate insulating film 12 and second polysilicon film (or the second laminated film) 10 are selectively etched in a self-alignment manner so that pats of them can be left behind between the adjacent booster plates 6 and on parts of the upper surfaces of the booster plates 6. As a result, word lines (control gates) 13a, selection gate lines 13b and floating gates 10 are formed.

After this, N+ diffusion layers 14 are formed into the drain portion and source portion of the NAND cell by the ion-implantation. At this time, since the drain/source region between the cell transistors of the NAND cell are covered with the booster plates 6, the N+ diffusion layers 14 are not formed between the cell transistors.

Next, as shown in FIGS. 1 to 3, an insulating film 15 is formed on the entire surface of the resultant structure and a contact hole 16 is formed in the insulating film 15. Further, a tungsten plug 17 is filled in the contact hole 16 and a bit line 18 formed of aluminum (Al) and connected to the tungsten plug 17 is formed. Then a passivation film 19 is formed to cover the entire surface. Thus, the NAND type EEPROM of the first embodiment is manufactured.

As described above, according to the first embodiment, the program/erase/read operations can be effected at a lower voltage in comparison with the NAND type EEPROM having the booster plates described in the document 5 by increasing the capacitance between the booster plate and the floating gate.

Further, the junction capacitance of the channel portion of the NAND string is made smaller by eliminating the source/drain region directly below the booster plate and the capacitive coupling ratio between the control gate and the channel portion can be increased. As a result, the program inhibition voltage can be enhanced and the margin against the erroneous programming can be enlarged accordingly, thereby making it possible to enhance the reliability.

Next, the construction of a NAND type EEPROM according to a second embodiment of this invention is explained. In the first embodiment, the field oxide film is used as the element isolation region, but this invention can be effectively applied when the trench element isolation technique (STI=Shallow Trench Isolation) is used instead of the field oxide film.

Figure 17:
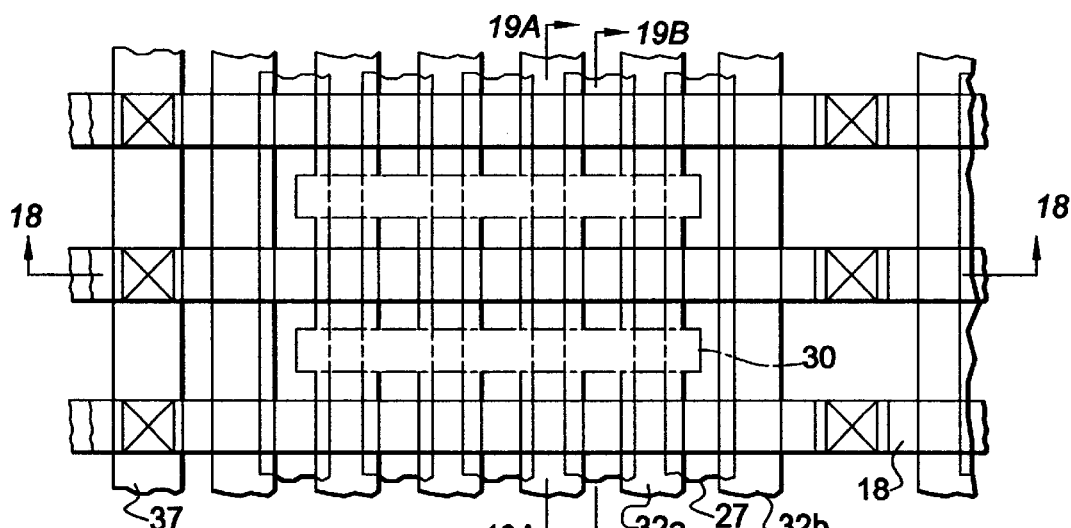
FIG. 17 is a plan view showing the construction of a NAND type EEPROM according to a second embodiment of this invention.
Figure 18:
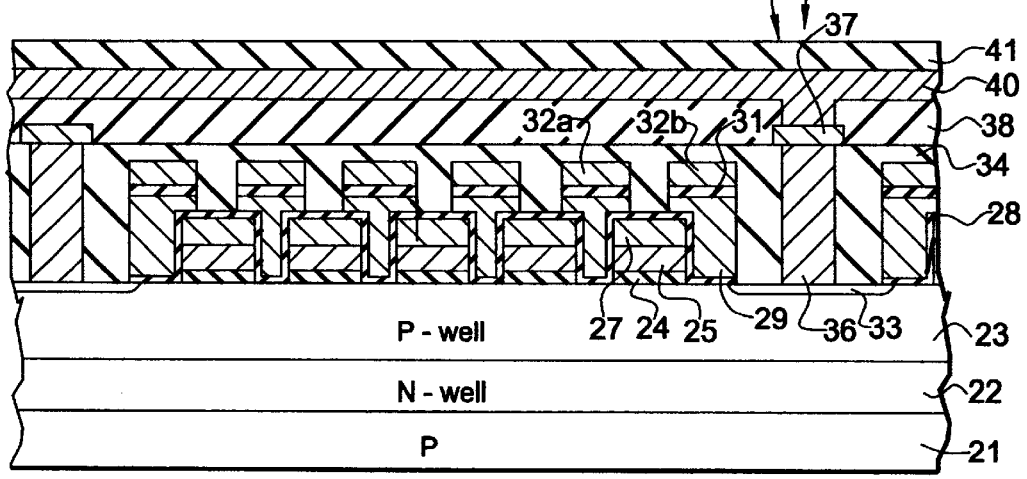
FIG. 18 is a cross sectional veiw taken along the line 18—18 of FIG. 17.
Figure 19A:
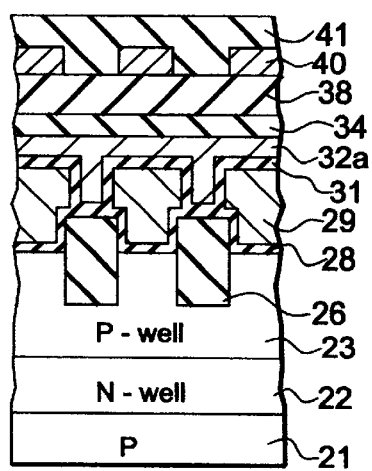
FIG. 19A is a cross sectional view taken along the line 19A—19A of FIG. 17.
Figure 19B:
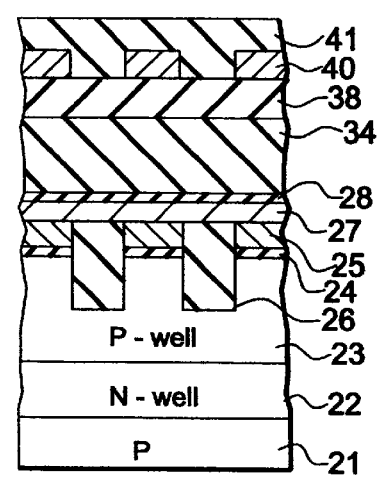
FIG. 19B is a cross sectional view taken along the line 19B—19B of FIG. 17.

FIG. 17 is a plan view showing the NAND type EEPROM of the second embodiment. FIG. 18 is a cross sectional view taken along the line 18—18 of FIG. 17. FIG. 19A is a cross sectional view taken along the line 19A—19A of FIG. 17. FIG. 19B is a cross sectional view taken along the line 19B—19B of FIG. 17.

As shown in FIG. 18, an N well 22 is formed on a p-type silicon semiconductor substrate 21. A P well 23 is formed in the N well 22. As shown in FIGS. 19A, 19B, trench element isolation regions 26 which are element isolation regions are formed in the P well 23. A NAND cell having four memory cell transistors and two selection gate transistors disposed on both sides thereof is formed in a region surrounded by the trench element isolation region 26 as follows.

As shown in FIGS. 18, 19A, 19B, first gate insulating films 24 each formed of a thermal oxide film with a film thickness of 5 nm to 20 nm are formed on the P well 23. Further, first polysilicon films 25 with a film thickness of 100 nm or more are formed on the respective first gate insulating films 24. A second polysilicon film (or a second laminated film of a silicide film and a polysilicon film) 27 with a film thickness of 100 nm or more is formed on each of the first polysilicon films 25 and part of the trench element isolation regions 26. The first polysilicon film 25 and the second polysilicon film (or the second laminated film) 27 are formed in a linear form extending along the direction of word lines 32a so as to constitute a booster plate with two-layered structure.

Further, as shown in FIG. 18, a second gate insulating film 28 formed of a thermal oxide film with a film thickness of 5 nm to 10 nm is formed on the P well 23 and the booster plates. Floating gates 29 each formed of a third polysilicon film (or a third laminated film of a silicide film and a polysilicon film) with a film thickness of 100 nm or more are formed on part of the trench element isolation regions 26 and the second gate insulating film 28.

A third gate insulating film 31 with a film thickness of 15 nm to 40 nm is formed on each of the floating gates 29 as shown in FIG. 18. Further, a fourth polysilicon film (or a fourth laminated film of a silicide film and a polysilicon film) with a film thickness of 100 nm to 400 nm is formed on each of the third gate insulating films 31. The word lines (control gates) 32a of the four memory cells transistors and the selection gate lines 31b of the selection gate transistors disposed on both sides of the memory cell transistors are formed of the fourth polysilicon films (or the fourth laminated films). Further, in the drain portion and source portion of the NAND cell, N+ diffusion layers 33 are formed.

As shown in FIG. 18, an insulating film 34 is formed on the entire surface of the resultant structure and tungsten plugs 36 connected to the drain or source portions are formed in the insulating film 34. Further, intermediate contact regions 37 each formed for contact between the source line and the bit line and connected to the tungsten plug 36 are formed on the insulating film 34.

As shown in FIGS. 18, 19A, 19B, an insulating film 38 is formed on the entire surface of the resultant structure and bit lines 40 connected to the intermediate contact regions 37 are formed on the insulating film 38. Then, a passivation film 41 is formed on the entire surface of the resultant structure.

That is, the NAND type EEPROM of the second embodiment is constructed as follows. The booster plates (first electrodes) each having a two-layered structure formed of the first polysilicon film 25 and the second polysilicon film (or the second laminated film) 27 are insulatively formed on the P-type silicon semiconductor substrate 1 with the first gate insulating films 24 disposed therebetween. The floating gates (second electrodes) 29 are disposed on at least parts of the upper surfaces of the booster plates with the second gate insulating film 28 disposed therebetween.

Further, the word lines (third electrodes) 32a are insulatively formed on the floating gates 29 with the third gate insulating films 31 disposed therebetween. A memory cell unit (NAND cell) is constructed by serially connecting a plurality of (in this example, four) electrically rewritable memory cells each having the above two-layered stacked structure and connecting the selection gate transistors to both sides of the series-connected memory cells. Then, memory cell units having the same construction as the above memory cell unit are arranged in a matrix form to form a memory cell array.

The NAND type EEPROM has the selection gate lines 32b, row selection means and column selection means. The selection gate line 32b connects the memory cell unit to the bit line 40 or source line (the intermediate contact region) 37. The row selection means selects the word line 32a and selection gate line 32b of the memory cell array. The column selection means selects the bit line 40 of the memory cell array.

The operation of the NAND type EEPROM with the above construction is susbstantially the same as that of the NAND type EEPROM disclosed in the document 5 and the bias states at the time of the program, erase and read operations are shown in FIG. 4. The booster plate is applied with a program voltage of 13V at the time of program, a voltage of 0V at the time of erase and a power supply voltage Vcc at the time of read.

Now, the above-described two advantages of the memory cell having the booster plate are considered. First, the capacitive coupling ratio at the time of program becomes as follows. As described above, the capacitive coupling ratio $\gamma b$ of the memory cell having the booster plate is expressed as follows.

$$\gamma b=(Ccf+Cbf)/(Cfs+Ccf+Cbf)$$

where Ccf is the capacitance between the control gate (word line) and the floating gate, Cbf is the capacitance between the booster plate and the floating gate, and Cfs is the capacitance between the floating gate and the substrate.

Cbf of the memory cell in the NAND type EEPROM disclosed in the document 5 is determined by the capacitance formed between the side wall of the floating gate and the booster plate. However, in the memory cell of the NAND type EEPROM of the second embodiment, Cbf is the sum of the capacitance formed between the side wall of the booster plate and the floating gate 29 and the capacitance formed between part of the upper surface of the booster plate and the floating gate 29. Therefore, since the capacitive coupling ratio $\gamma b$ becomes larger in the memory cell in the second embodiment than in the memory cell in the NAND type EEPROM disclosed in the document 5, the program voltage at the time of program can be lowered.

Further, since the capacitive coupling ratio at the time of erase is expressed by $(1-\gamma b)$, a potential difference between the substrate and the floating gate 29 can be increased, the erase operation can be effected at a higher speed or the erase voltage can be lowered in comparison with a case of the NAND type EEPROM disclosed in the document 5. If the capacitive coupling ratio $\gamma b$ becomes larger, a voltage applied to the pass transistor at the time of read can be lowered.

Next, the capacitive coupling ratio between the control gate (word line) and the channel which is the other advantage is as follows. As described above, the capacitive coupling ratio Bb of the memory cell having the booster plate is expressed by the following equation.

$$Bb=(Cox+Cboot)/(Cox+Cboot+Cj)$$

where Cox is the total sum of gate capacitances between the control gate (word line) and the channel, Cboot is the total sum of gate capacitances between the booster plate and the channel, and Cj is the total sum of junction capacitances of the source and drain of the memory cell transistor.

In the memory cell of the NAND type EEPROM disclosed in the document 5, the source/drain region is formed directly below the booster plate. However, in the memory cell in the NAND type EEPROM of the second embodiment, the source/drain region directly below the booster plate is omitted and the portion can be formed as a semiconductor region having the same conductivity type as a portion directly below the floating gate 29. Therefore, the junction capacitance Cj of the channel portion of the NAND cell becomes smaller and the capacitive coupling ratio between the control gate (word line) 32a and the channel can be made larger. As a result, even if the voltage of the pass transistor is not set to an excessively high voltage at the time of program, the channel potential of the program inhibition NAND cell can be sufficiently raised and the margin against the erroneous programming can be improved.

Figure 23:
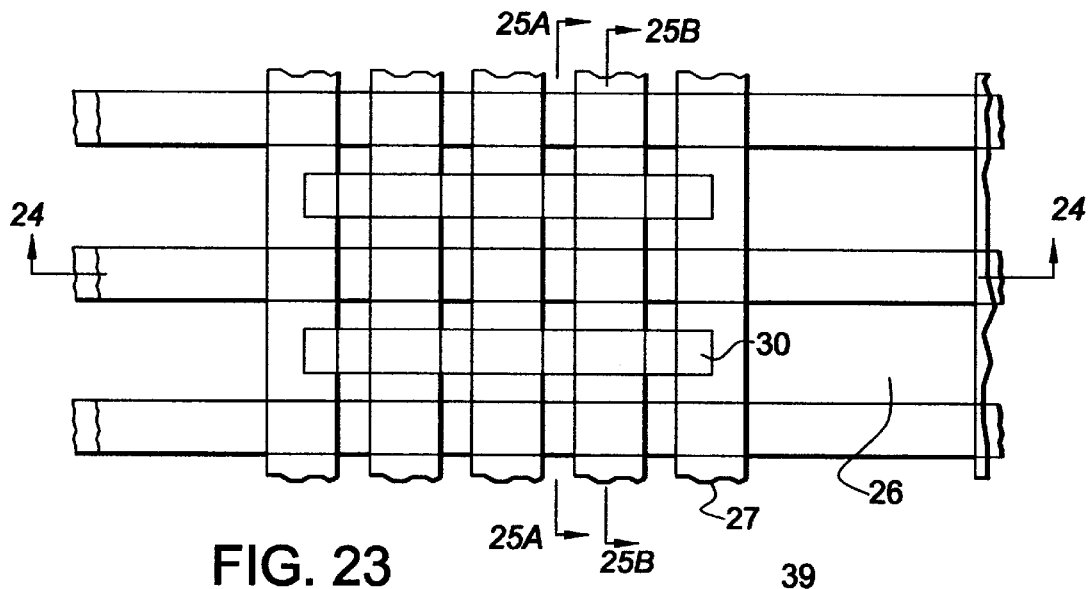
FIG. 23 is a plan view showing a manufacturing step of the NAND type EEPROM of the second embodiment.
Figure 24:
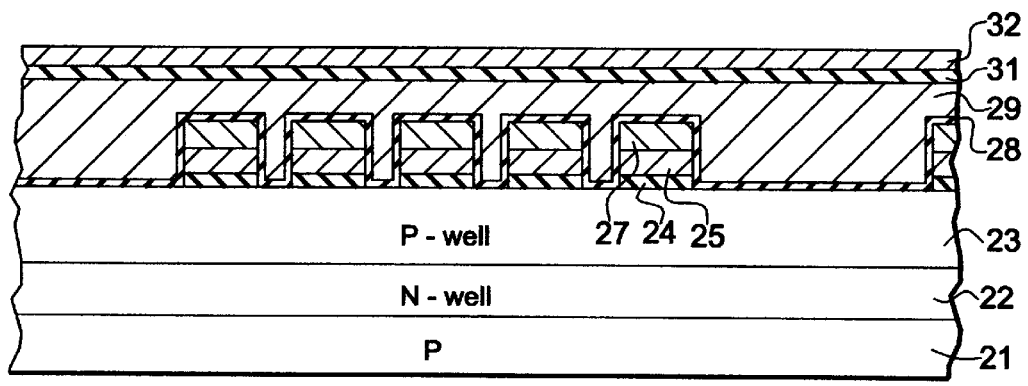
FIG. 24 is a cross sectional view taken along the word line direction of FIG. 23.
Figure 25A:
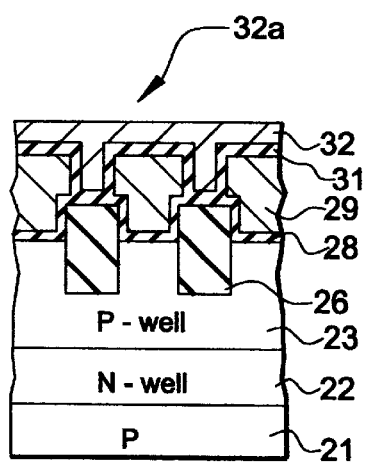
FIG. 25A is a cross sectional view taken along the word line direction of FIG. 23.
Figure 25B:
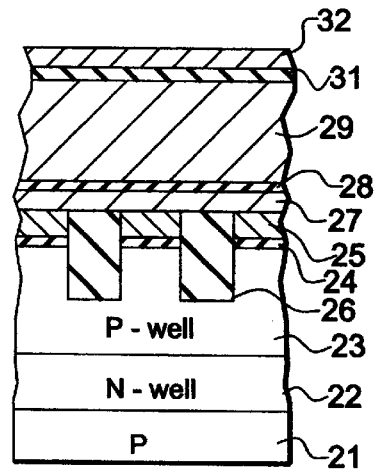
FIG. 25B is a cross sectional view taken along the word line direction of FIG. 23.
Figure 26:
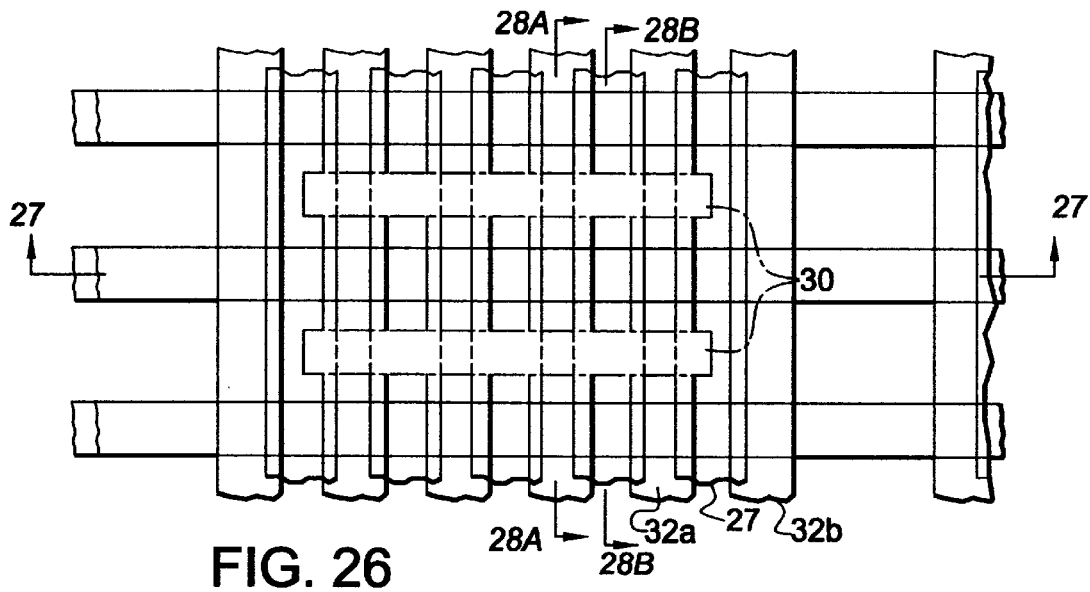
FIG. 26 is a plan view showing a manufacturing step of the NAND type EEPROM of the second embodiment.
Figure 27:
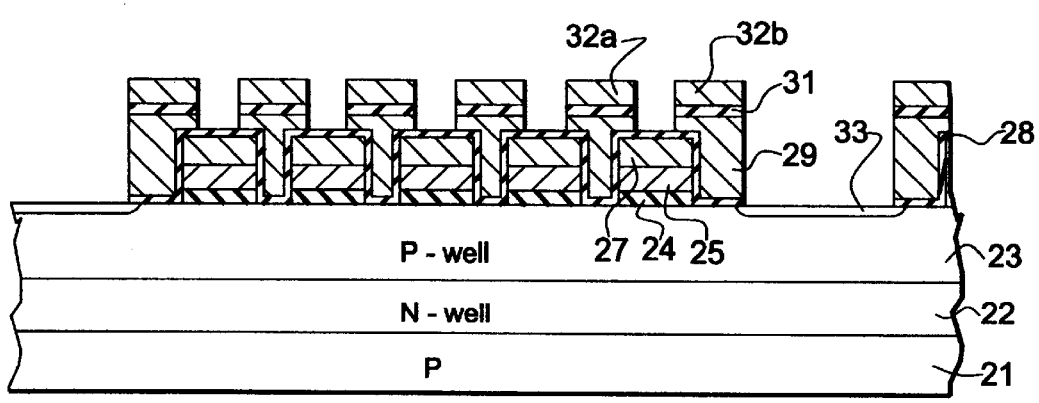
FIG. 27 is a cross sectional view taken along the word line direction of FIG. 26.
Figure 28A:
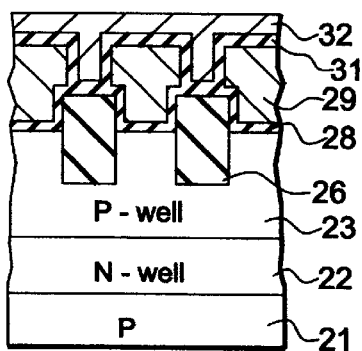
FIG. 28A is a cross sectional view taken along the word line direction of FIG. 26.
Figure 28B:
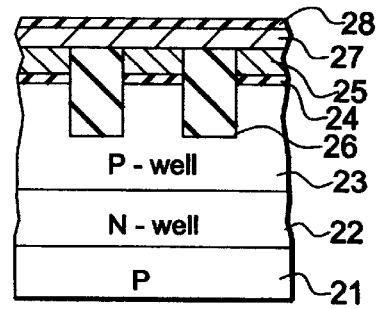
FIG. 28B is a cross sectional view taken along the word line direction of FIG. 26.

Next, a method for manufacturing the NAND type EEPROM of the second embodiment is explained. FIGS. 20 to 28B are plan views and cross sectional views showing the manufacturing process of the NAND type EEPROM of the second embodiment. FIGS. 20, 23, 26 are plan views showing the manufacturing process of the NAND type EEPROM of the second embodiment. FIGS. 21, 24, 27 are cross sectional views taken along the bit line direction of the above plan views and FIGS. 22A, 22B, 25A, 25B, 28A, 28B are cross sectional views taken along the word line direction of the above plan views.

As shown in FIGS. 20 to 22A, an N well 22 is formed on a p-type silicon semiconductor substrate 21 and a P well 23 is formed in the N well 22. Then, trench element isolation regions (STI) 26 are formed in the P well 23. A method for manufacturing a NAND cell in a region surrounded by the trench element isolation region 26 is explained below. In this example, it is assumed that the NAND cell is formed of four memory cell transistors and two selection gate transistors disposed on both sides of the memory cell transistors.

After forming the P well 23 in the N well 22, a first gate insulating film 24 formed of a thermal oxide film with a film thickness of 5 nm to 20 nm is formed. Further, a first polysilicon film 25 with a film thickness of 100 nm or more is formed on the first gate insulating film 24.

Next, the first polysilicon film 25 is patterned into a NAND string form. Trenches are formed with the patterned first polysilicon films 25 used as a mask and a silicon oxide film ($SiO_2$) which is an insulating film is filled in the trenches by the CVD method to form trench element isolation regions 26.

Next, a second polysilicon film (or a second laminated film of a silicide film and a polysilicon film) 27 with a film thickness of 100 nm or more is formed on the entire surface of the resultant structure. Then, the second polysilicon film (or the second laminated film) 27 and the first polysilicon film 25 are both patterned in a linear form along the control gate line direction. As a result, the booster plates each having the two-layered structure including the first polysilicon film 25 and the second polysilicon film (or the second laminated film) 27 which are electrically connected to each other are formed.

Next, as shown in FIGS. 23 to 25B, a second gate insulating film 28 formed of a thermal oxide film with a film thickness of 5 nm to 20 nm is formed. A third polysilicon film (or a third laminated film of a silicide film and a polysilicon film) 29 with a film thickness of 100 nm or more is formed on the second gate insulating film 28. Further, as shown in FIG. 25A, isolation trenches 30 are formed in the third polysilicon film (or the third laminated film) 29 above the trench element isolation regions 26 which are adjacent in the control gate line direction.

After this, a third gate insulating film 31 with a film thickness of 15 nm to 40 nm is formed on the third polysilicon film (or the third laminated film) 29. Further, a fourth polysilicon film (or a fourth laminated film of a silicon film and a polysilicon film) 32 with a film thickness of 100 nm to 400 nm is formed on the third gate insulating film 31.

Next, as shown in FIGS. 26 to 28B, the fourth polysilicon film (or the fourth laminated film) 32, third gate insulating film 31 and third polysilicon film (or the third laminated film) 29 are selectively etched in a self-alignment manner so that pats of them can be left behind between the adjacent booster plates and on parts of the upper surfaces of the booster plates. As a result, word lines (control gates) 32a, selection gate lines 32b and floating gates 29 are formed.

After this, $N^+$ diffusion layers 33 are formed into the drain portion and source portion of the NAND cell by the ion-implantation. At this time, since the drain/source regions between the cell transistors of the NAND cell are covered with the booster plates, the $N^+$ diffusion layers are not formed between the cell transistors.

Next, as shown in FIGS. 17 to 19B, an insulating film 34 is formed on the entire surface of the resultant structure and first contact holes 35 are formed in the insulating film 34. Further, a tungsten plug 36 is filled in each of the contact holes 35 and intermediate contact regions 37 for contact between the source lines and the bit lines are formed of first metal wirings connected to the tungsten plugs 36.

After this, an insulating film 38 is formed on the entire surface of the resultant structure and second contact holes 39 are formed in the insulating film 38. Further, bit lines 40 of second metal wirings connected to the intermediate contact regions 37 are formed in the contact holes 39. Then, a passivation film 41 is formed to cover the entire surface. Thus, the NAND type EEPROM of the second embodiment is manufactured.

As described above, according to the second embodiment, the program/erase/read operations can be effected at a lower voltage in comparison with the NAND type EEPROM having the booster plates described in the document 5 by increasing the capacitance between the booster plate and the floating gate.

Further, the junction capacitance of the channel portion of the NAND string is made smaller by omitting the source/drain region directly below the booster plate and the capacitive coupling ratio between the control gate and the channel portion can be increased. As a result, the program inhibition voltage can be enhanced and the margin against the erroneous programming can be enlarged accordingly, thereby making it possible to enhance the reliability.

As described above, according to the embodiments of this invention, a NAND type EEPROM in which the capacitance between the booster plate and the floating gate can be increased and the program/erase/read operations can be effected at a low voltage and a manufacturing method thereof can be provided. Further, by eliminating the source/drain region directly below the booster plate, that is, by not forming the diffusion layer having a different conductivity type from the channel portion in the region of the semiconductor substrate lying directly below the booster plate, the junction capacitance of the channel portion of the NAND string can be made small and the capacitance coupling ratio between the control gate and the channel can be increased. Thus, a NAND type EEPROM in which the program inhibition voltage at the time of program can be enhanced and the margin against the erroneous programming can be enlarged accordingly, thereby making it possible to enhance the reliability and a manufacturing method thereof can be provided.

Additional advantages and modifications will readily occur to those skilled in the art. Therefore, the invention in its border aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:

a conductive body formed on a semiconductor substrate;

a floating gate insulatively formed on said conductive body with an insulating film disposed therebetween, a capacitor being formed between said floating gate and part of the upper surface and the side wall of said floating gate and part of the upper surface and the side wall of said conductive body; and a control gate insulatively formed on said floating gate with an insulating film disposed therebetween, wherein said conductive body is formed in a linear from along the wiring direction of said control gate.

2. A semiconductor memory device comprising:

conductive bodies formed on a semiconductor substrate;

floating gates insulatively formed on said conductive bodies with an insulating film disposed therebetween, capacitors being each formed between said floating gate and at least part of the upper surface of said conductive body; and control gates insulatively formed on said floating gates with an insulating film disposed therebetween, said control gates extending in parallel with said conductive bodies, wherein memory cell transistors, which include said floating gates and said control gates, are connected in series with one another, thereby forming a memory cell unit.

3. A semiconductor memory device according to claim 2, wherein said conductive bodies are formed in a linear form along the wiring direction of said control gates.

4. A semiconductor memory device according to claim 3, wherein said conductive bodies are formed between the memory cell transistors.

5. A semiconductor memory device according to claim 4, wherein regions of said semiconductor substrate which lie below said conductive body and said floating gate have the same conductivity type.

6. A semiconductor memory device according to claim 2, wherein said conductive body has a laminated structure having first and second conductive films laminated and an insulating material is filled in trenches formed in self-alignment with said first conductive film to form trench element isolation regions.

7. A semiconductor memory device according to claim 2, wherein a program voltage is applied to said conductive body at the time of program into the memory cell transistor.

8. A semiconductor memory device according to claim 2, wherein a power supply voltage is applied to said conductive body at the time of read of the memory cell transistor.

9. A semiconductor memory device according to claim 2, wherein said memory cell unit has a NAND structure.

10. The semiconductor memory device of claim 2, further including an insulating film disposed between the conductive body and the semiconductor substrate.

11. A semiconductor memory device having memory cells, comprising:

a first insulating film formed on a semiconductor substrate;

plate electrodes formed on the first insulating film;

second insulating films formed on the plate electrodes;

third insulating film formed on the semiconductor substrate such that the third insulating films are located between adjacent ones of the plates electrodes;

floating gates formed insulatively on part of upper surfaces and side surfaces of the plate electrodes with the second insulating film disposed therebetween and on the third insulating films;

fourth insulating films formed on the floating gates; and control gates formed on the fourth insulating films, the control gates extending in parallel with the plate electrodes.

12. A semiconductor memory device comprising:

a conductive body formed on a semiconductor substrate;

a floating gate insulatively formed on said conductive body with an insulating film disposed therebetween, a capacitor being formed between said floating gate and part of the upper surface and the side wall of said conductive body; and a control gate insulatively formed on said floating gate with an insulating film disposed therebetween, said control gate extending in parallel with said conductive body.

13. A semiconductor memory device according to claim 12, wherein regions of said semiconductor substrate that lie below said conductive body and said floating gate have the same conductivity type.

14. A semiconductor memory device according to claim 12, wherein said conductive body has a laminated structure having first and second conductive films laminated and an insulating material is filled in trenches formed in self-alignment with said first conductive film to form trench element isolation regions.

15. The semiconductor memory device of claim 12, further including an insulating film disposed between the conductive body and the semiconductor substrate.

* * * * *